(12) United States Patent
Chen et al.

(10) Patent No.: US 9,029,172 B2
(45) Date of Patent: May 12, 2015

(54) ON-CHIP POLY-TO-CONTACT PROCESS MONITORING AND RELIABILITY EVALUATION SYSTEM AND METHOD OF USE

(75) Inventors: Fen Chen, Williston, VT (US); Roger A. Dufresne, Fairfax, VT (US); Timothy D. Sullivan, Underhill, VT (US); Yanfeng Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 616 days.

(21) Appl. No.: 13/354,547

(22) Filed: Jan. 20, 2012

(65) Prior Publication Data

US 2013/0191047 A1 Jul. 25, 2013

(51) Int. Cl.
*H01L 21/00* (2006.01)
*H01L 21/66* (2006.01)

(52) U.S. Cl.
CPC .............. *H01L 22/34* (2013.01); *H01L 22/12* (2013.01); *H01L 2924/00* (2013.01); *H01L 2924/0002* (2013.01)

(58) Field of Classification Search
CPC ..................................................... H01L 22/30
USPC ...................................................... 438/14–18
See application file for complete search history.

(56) References Cited

U.S. PATENT DOCUMENTS

| | | | |
|---|---|---|---|
| 4,571,538 A | 2/1986 | Chow | |
| 5,956,566 A | 9/1999 | Lin et al. | |
| 6,563,320 B1 | 5/2003 | Look et al. | |
| 6,734,028 B1* | 5/2004 | Yang et al. | 438/17 |
| 6,905,897 B1 | 6/2005 | Hsu | |
| 7,688,083 B2 | 3/2010 | De Vries et al. | |
| 7,718,448 B1 | 5/2010 | Brisbin et al. | |
| 7,804,994 B2 | 9/2010 | Adel et al. | |
| 7,935,965 B1 | 5/2011 | Brozek | |
| 2004/0056248 A1* | 3/2004 | Liu et al. | 257/48 |
| 2009/0272973 A1 | 11/2009 | Yoshida et al. | |
| 2010/0055809 A1 | 3/2010 | Pak et al. | |
| 2010/0248481 A1 | 9/2010 | Schultz | |

OTHER PUBLICATIONS

P. Muroke, "Flash Memory Field Failure Mechanisms", IEEE 06CH37728 44th Annual International Reliability Physics Symposium, San Jose, 2006, pp. 313-316.
S. Yokogawa et al., "Statistics of Breakdown Field and Time-Dependent Dielectric Breakdown in Contact-to-Poly Modules", IEEE International Reliability Physics Symposium, 2011, pp. 149-154.

* cited by examiner

*Primary Examiner* — Brook Kebede
(74) *Attorney, Agent, or Firm* — Michael Lestrange; Roberts Mlotkowski Safran & Cole, P.C.

(57) ABSTRACT

An on-chip poly-to-contact process monitoring and reliability evaluation system and method of use are provided. A method includes determining a breakdown electrical field of each of one or more shallow trench isolation (STI) measurement structures corresponding to respective one or more original semiconductor structures. The method further includes determining a breakdown voltage of each of one or more substrate measurement structures corresponding to the respective one or more original semiconductor structures. The method further includes determining a space between a gate and a contact of each of the one or more original semiconductor structures based on the determined breakdown electrical field and the determined breakdown voltage.

16 Claims, 14 Drawing Sheets

US 9,029,172 B2

ON-CHIP POLY-TO-CONTACT PROCESS MONITORING AND RELIABILITY EVALUATION SYSTEM AND METHOD OF USE

FIELD OF THE INVENTION

The invention relates to semiconductor structures and methods of analysis and, more particularly, to an on-chip poly-to-contact process monitoring and reliability evaluation system and method of use.

BACKGROUND

Sizes of semiconductor structures in advanced integrated circuits are progressively decreasing with technology demands. As a result, a minimum spacing between a contact and a polysilicon control gate in, e.g., a metal-oxide-semiconductor field-effect transistor (MOSFET) is also decreasing. It is known that in such transistors, failures in flash memory (e.g., leakages between word and bit lines in the memory) may be caused by breakdown (e.g., inadequate spacing) between control gates and diffusion contacts. With technology scaling, this breakdown between the control gates and the diffusion contacts is exacerbated, even for logic circuits.

To prevent the breakdown between control gates and diffusion contacts in semiconductor structures, on-chip processing (e.g., lithographic processing) of the control gates and the diffusion contacts may need to be monitored, to fabricate these structures. More specifically, actual spacing between the control gates and the diffusion contacts may need to be electrically-determined. However, no known solution exists to monitor the on-chip processing of the control gates and the diffusion contacts and/or to electrically determine their actual spacing. In addition, due to technology scaling, proper sizing and alignment of the control gates and the diffusion contacts are more difficult to achieve and can no longer be guaranteed.

Accordingly, there exists a need in the art to overcome the deficiencies and limitations described hereinabove.

SUMMARY

In a first aspect of the invention, a method includes determining a breakdown electrical field of each of one or more shallow trench isolation (STI) measurement structures corresponding to respective one or more original semiconductor structures. The method further includes determining a breakdown voltage of each of one or more substrate measurement structures corresponding to the respective one or more original semiconductor structures. The method further includes determining a space between a gate and a contact of each of the one or more original semiconductor structures based on the determined breakdown electrical field and the determined breakdown voltage.

In another aspect of the invention, a method of on-chip poly-to-contact process monitoring and reliability evaluation, includes determining a breakdown electrical field of one or more shallow trench isolation (STI) measurement structures corresponding to respective one or more original semiconductor structures. The method further includes determining a breakdown voltage of one or more substrate measurement structures corresponding to the respective one or more original semiconductor structures. The method further includes determining a space distribution of spacing between a gate and a contact of each of the one or more original semiconductor structures based on the determined breakdown electrical field and the determined breakdown voltage.

In yet another aspect of the invention, a structure includes an original semiconductor structure including a substrate, at least one contact formed on the substrate, an oxide layer formed on the substrate, and a gate formed on the oxide layer. The structure further includes a substrate measurement structure including a copy of the original semiconductor structure that is placed on a kerf test structure. A contact of the substrate measurement structure is shifted one of closer to and farther from a gate of the substrate measurement structure in comparison to the corresponding original semiconductor structure.

In yet another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
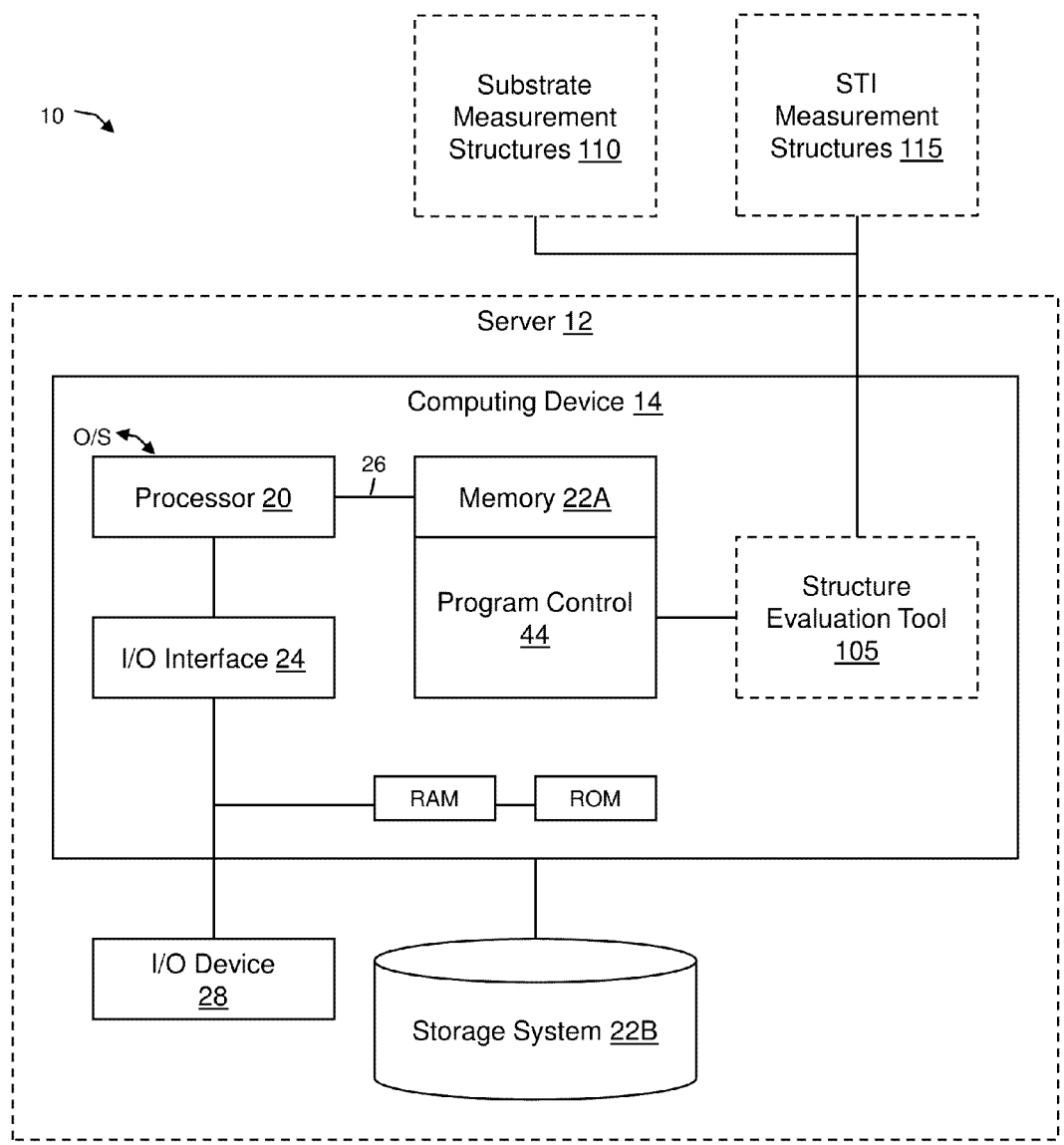
FIG. 1 is an exemplary environment for implementing steps in accordance with aspects of the invention.

The invention relates to semiconductor structures and methods of analysis and, more particularly, to an on-chip poly-to-contact process monitoring and reliability evaluation system and method of use. More specifically, in embodiments, the present invention includes a set of semiconductor measurement structures (e.g., MOSFETs), some of which include a contact and a polysilicon control gate on a thick oxide with contact-to-gate misalignment within a constant gate-to-gate pitch. The present invention further includes an electrical voltage ramp dielectric breakdown (VRDB) test process and a data analysis process, to determine an actual gate-to-contact spacing in each of the semiconductor measurement structures. Advantageously, the spacing between a control gate and a contact can now be accurately determined, and thus, process defects of these structures can be identified, e.g., when the spacing is less than a predetermined threshold. Accordingly, the present invention provides accurate inline process monitoring, and leads to successful reliability qualification, of semiconductor structures.

More specifically, in embodiments, the present invention allows for designing a set of one or more substrate measurement structures and one or more shallow trench isolation (STI) measurement structures. These measurement structures can be used to determine realistic electrical parameters (e.g., a breakdown voltage, a breakdown electric field, etc.) of the originally-designed semiconductor structures to be evaluated. The VRDB test process may use the STI measurement structures to determine a breakdown electrical field ($E_{bd}$) of each of the STI measurement structures, and may use the substrate measurement structures to determine a realistic breakdown voltage ($V_{bd}$) of each of the substrate measurement structures.

In embodiments, based on the determined breakdown electrical field of the STI measurement structures and the determined breakdown voltage of the substrate measurement structures, the data analysis process may determine a minimum space (e.g., a worst-case space) for each of the original semiconductor structures to be evaluated. The data analysis process may further determine a space distribution which includes a percentage of distribution of the determined minimum spaces of the original semiconductor structures. The data analysis process may also use a fatal area ratio and a design area ratio of each of the original semiconductor structures to scale (e.g., more accurately determine) one or more electrical parameters (e.g., a cumulative failure, a breakdown voltage, etc.) of each of the original semiconductor structures to large product level structures.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In embodiments, the server 12 may include any mobile computing device, such as a mobile phone, a laptop, a video camera, etc. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with an external I/O device/resource 28 and the storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handset, keyboard, etc.

In general, the processor 20 executes computer program code (e.g., program control 44), which can be stored in the memory 22A and/or storage system 22B. Moreover, in accordance with aspects of the invention, the program control 44 controls a structure evaluation tool 105, e.g., the processes described herein. The structure evaluation tool 105 can be implemented as one or more program code in the program control 44 stored in memory 22A as separate or combined modules. Additionally, the structure evaluation tool 105 may be implemented as separate dedicated processors or a single or several processors to provide the function of this tool. Moreover, it should be understood by those of ordinary skill in the art that the structure evaluation tool 105 is used as a general descriptive term for providing the features and/or functions of the present invention.

While executing the computer program code, the processor 20 can read and/or write data to/from memory 22A, storage system 22B, and/or I/O interface 24. The program code executes the processes of the invention, for example, functions of the structure evaluation tool 105, e.g., provide poly-to-contact process monitoring and reliability evaluation. The bus 26 provides a communications link between each of the components in the computing device 14.

In embodiments, the structure evaluation tool 105 can design and/or use a set of one or more substrate measurement structures 110 and one or more shallow trench isolation (STI) measurement structures 115, to determine realistic electrical parameters (e.g., a breakdown voltage, a breakdown electric field, etc.) of one or more original semiconductor structures (e.g., MOSFETs) to be evaluated. In embodiments, each of the substrate measurement structures 110 and the STI measurement structures 115 may predominantly mirror (e.g., be a copy of) the original semiconductor structure to be evaluated and include a metallic contact and a polysilicon control gate. Moreover, each of the substrate measurement structures 110 may be different than the original semiconductor structure to be evaluated in that a control gate may be on thick oxide with contact-to-gate misalignment within a constant gate-to-gate pitch Likewise, each of the STI measurement structures 115 may be different than the original semiconductor structure to be evaluated in that a control gate may be on an STI structure, instead of on a thick oxide. This allows measured leakages and breakdown voltages in the STI measurement structures 115 to be more accurate. The set of the substrate and STI measurement structures 110 and 115 may include predetermined numbers (e.g., thousands) of the substrate and STI measurement structures 110 and 115. The substrate and STI measurement structures 110 and 115 may be placed on a kerf test structure of an integrated circuit of a particular size (e.g., 32 nm) that includes the original semiconductor structure to be evaluated.

In accordance with further aspects of the invention, each of the substrate measurement structures 110 and the STI measurement structures 115 can be designed to include an excessive shift of the contact in comparison to the respective original semiconductor structure. More specifically, in embodiments, each contact may be designed to be shifted closer to each respective control gate or farther from each respective control gate, in comparison to the original semiconductor structure. The shift of each contact may be of one or more predetermined distances. The shift of each contact may be designed while maintaining a pitch between the corresponding control gate and one or more neighboring control gates of measurement structures. The designed shift of each contact allows for a more accurate measurement of leakage current and breakdown voltage between the respective control gate and the contact.

In embodiments, the structure evaluation tool 105 can include an electrical voltage ramp dielectric breakdown (VRDB) test process and a data analysis process to determine (e.g., back-calculate) an actual gate-to-contact spacing in each of the original semiconductor structures to be evaluated based on the designed substrate and STI measurement structures 110 and 115. Advantageously, the spacing between a control gate and a contact is accurately determined, and thus, process defects of these structures are identified, e.g., when the spacing is less than a predetermined threshold. Accordingly, the present invention provides accurate inline process monitoring, and leads to successful reliability qualification, of the semiconductor structures.

More specifically, in embodiments, the structure evaluation tool 105 can use the STI measurement structures 115 to determine a breakdown electrical field ($E_{bd}$) of each of the STI measurement structures 115. The structure evaluation tool 105 may further use the substrate measurement structures 110 to determine a realistic breakdown voltage ($V_{bd}$) of each of the substrate measurement structures 110. Based on the determined breakdown electrical field of the STI measurement structures 115 and the determined breakdown voltage of the substrate measurement structures 110, the structure evaluation tool 105 may determine a minimum space (e.g., a worst-case space) for each of the original semiconductor structures to be evaluated. For example, a minimum space $x_{eff1}$ may be determined based on the following equation:

$$x_{eff1} = \frac{V_{bd}}{E_{bd}}. \quad (1)$$

In alternative or additional embodiments, a minimum space $x_{eff2}$ may be determined based on the following equation:

$$x_{eff2} = x_{drawn} - dx_{bias}, \quad (2)$$

where $x_{drawn}$ is a drawn space in the original semiconductor structure to be evaluated, and $dx_{bias}$ is a measured (actual) contact shift in the corresponding substrate and the STI measurement structures 110 and 115.

In embodiments, the structure evaluation tool 105 can use the minimum space $x_{eff1}$ and the minimum space $x_{eff2}$ for a self-consistency check by, e.g., comparing them and determining whether a difference between them is greater than a predetermined threshold. Based on the determined minimum space for each of the original semiconductor structures, the structure evaluation tool 105 may determine a space distribution which includes a percentage of distribution for each determined minimum space value. The structure evaluation tool 105 may shift the determined space distribution by one or more known shift values of contacts in the substrate and STI measurement structures 110 and 115, to determine a ground rule (e.g., nominal case) space distribution of the original semiconductor structures (e.g., whose contacts are not shifted).

In accordance with further aspects of the invention, the structure evaluation tool 105 can use a fatal area ratio of the original semiconductor structures and a design area ratio of the original semiconductor structures to scale the determined electrical parameters (e.g., electrical field breakdown, voltage breakdown, minimum space, etc.) of the substrate and/or STI measurement structures 110 and 115. The fatal area ratio includes a ratio of a plurality of fatal areas (e.g., components such as a contact) in the original semiconductor structures, while the design area ratio includes a ratio of a plurality of original design areas in the original semiconductor structures.

For example, when there are three original semiconductor structures, the fatal area ratio may be 1:3:6, indicating 1 fatal area, 3 fatal areas, and 6 fatal areas in the three original semiconductor structures, respectively. For the same three original semiconductor structures, the design area ratio may be 1:10:100, indicating 1 original design area, 10 original design areas, and 100 original design areas in the three original semiconductor structures, respectively. The structure evaluation tool 105 may determine the fatal area ratio based on the determined minimum spaces of the substrate and STI measurement structures 110 and 115 and whether these values are less than a predetermined threshold indicating a component (e.g., a contact and/or a control gate) is fatally defective.

Scaling the determined electrical parameters of the substrate and/or STI measurement structures 110 and 115 based on the fatal and design area ratios of the original semiconductor structures assumes that size dependence is the same for both the substrate and STI measurement structures 110 and 115. The scaling of the determined electrical parameters further increases the accuracy of the electrical parameters in reflecting a real product case. For example, in embodiments, the fatal and design area ratios of the original semiconductor structures can be used to more accurately determine (e.g., scale) a cumulative failure of each of the original semiconductor structures due to a measured breakdown voltage $V_{bd}$ in a measurement structure (e.g., one of the STI measurement structures 115). More specifically, in embodiments, a scaled cumulative failure $F_2$ of an original semiconductor structure may be determined based on the following equation:

$$F_2(t) = 1 - \left( \exp\left[-\left(\frac{V_{db}}{V_{63}}\right)^\beta\right]^{n^k} \right) = 1 - \exp\left[-\left(\frac{V_{bd}}{V_{63} \times n^{k/\beta}}\right)^\beta\right], \quad (3)$$

where t is a time, $V_{63}$ is a measured breakdown voltage in a measurement structure when a cumulative failure at the Weibull scale is about 63%, β is a slope of the cumulative failure per time of the measurement structure in a Weibull plot, n is a desired area ratio (e.g., an original design area over a fatal area, of the original semiconductor structure), and k is an extracted slope of the design area ratio over the fatal area ratio. One of skill in the art would recognize that these variables (e.g., $V_{63}$) and values of these variables are only exemplary, and other variables and variable values are contemplated by the invention, depending on the design structures (e.g., the substrate and/or STI measurement structures 110 and 115) involved and the electrical parameter to be scaled.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2A:
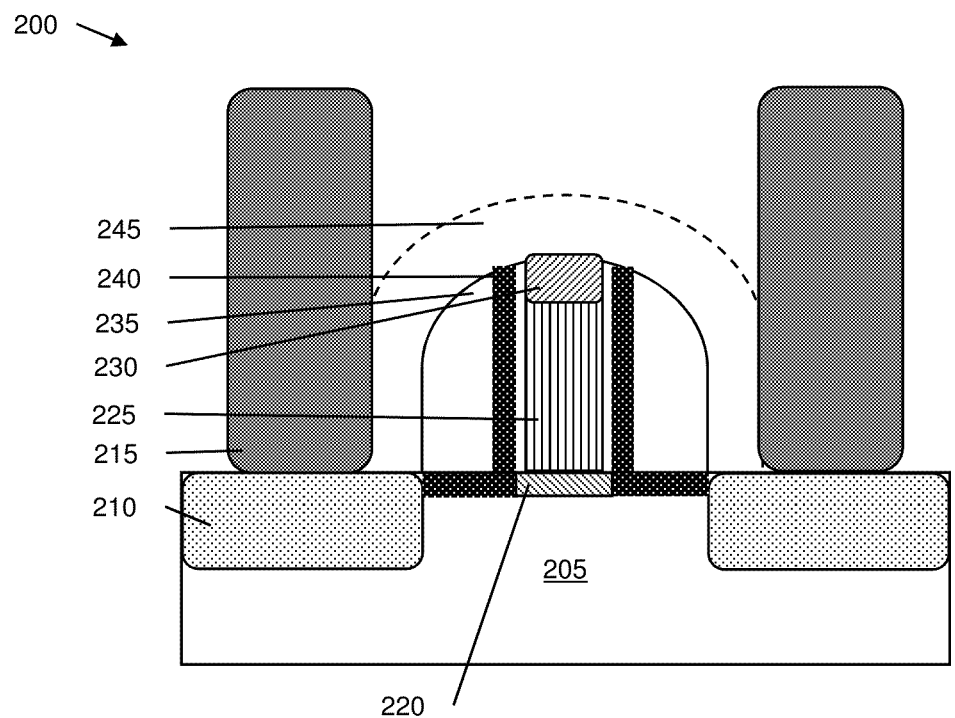
FIG. 2A is an exemplary substrate measurement structure for on-chip poly-to-contact process monitoring and reliability evaluation in accordance with aspects of the invention.

Referring to FIG. 2A, an exemplary substrate measurement structure 200 for on-chip poly-to-contact process monitoring and reliability evaluation is shown in accordance with aspects of the invention. In embodiments, the substrate measurement structures 110 of FIG. 1 can include the substrate measurement structure 200. The substrate measurement structure 200 may include a silicon substrate 205. Source and drain regions 210 may be formed in the silicon substrate 205, which may include respective metal silicide layers. Metallic contacts 215 may be formed on, and in physical contact with, the source and drain regions 210.

In embodiments, a gate dielectric layer 220 can be formed on, and in physical contact with, the silicon substrate 205, and can include a thick oxide, e.g., thicker than an oxide of the corresponding original semiconductor structure to be evaluated. This allows a measured leakage and breakdown voltage from the gate dielectric layer 220 to be minimized. Therefore, a measured leakage and breakdown voltage between a gate electrode 225 and the metallic contacts 215 may be more realistic. The gate electrode 225 may be formed on, and in physical contact with, the gate dielectric layer 220, and may include polysilicon material. A gate contact layer 230 may be formed on, and in physical contact with, the gate electrode 225, and may include a metal silicide layer. Gate sidewall spacers 235 may be formed on, and in physical contact with, the gate dielectric layer 220 and sidewalls of the gate electrode 225 and the gate contact layer 230. The gate sidewall spacers 235 may include a hardmask material, such as oxide or nitride.

In accordance with further aspects of the invention, a dielectric layer 240 can be formed between, and in physical contact with, the gate sidewall spacers 235, and formed on, and in physical contact with, the silicon substrate 205. In embodiments, the dielectric layer 240 may include a silicon dioxide. A dielectric layer 245 may be formed between the metallic contacts 215 and over the gate of the substrate measurement structure 200, e.g., the gate contact layer 230, the gate sidewall spacers 235, and the dielectric layer 240. In embodiments, the dielectric layer 245 may include a silicon nitride.

In embodiments, in addition to including a gate oxide thicker than that of the respective original semiconductor structure to be evaluated, the substrate measurement structure 200 can be designed to include an excessive shift of the metallic contacts 215 in comparison to the respective original semiconductor structure. More specifically, in embodiments, each of the metallic contacts 215 may be designed to be shifted closer to the gate electrode 225 or farther from the gate electrode 225, in comparison to the original semiconductor structure. The shift of the metallic contacts 215 may be of one or more predetermined distances, e.g., in nanometers (nm). The shift of the metallic contacts 215 may be designed while maintaining a pitch between the gate electrode 225 and one or more neighboring gate electrodes of substrate measurement structures. The designed shift of the metallic contacts 215 allows for a more accurate measurement of leakage current and breakdown voltage between the gate electrode 225 and the metallic contacts 215. More specifically, the substrate measurement structure 200 allows for a measured leakage current and a measured breakdown voltage between the gate electrode 225 and the metallic contacts 215 to not be dominated (e.g., overly affected) by a leakage and a breakdown voltage at the gate electrode 225.

Figure 2B:
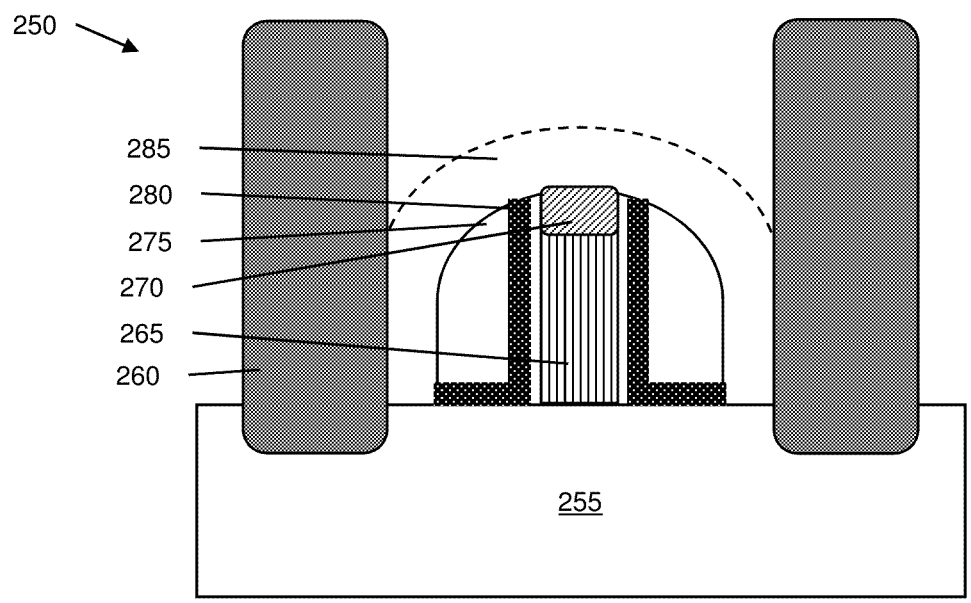
FIG. 2B is an exemplary shallow trench isolation (STI) measurement structure for on-chip poly-to-contact process monitoring and reliability evaluation in accordance with aspects of the invention.

Referring to FIG. 2B, an exemplary shallow trench isolation (STI) measurement structure 250 for on-chip poly-to-contact process monitoring and reliability evaluation is shown in accordance with aspects of the invention. In embodiments, the STI measurement structures 115 of FIG. 1 can include the STI measurement structure 250. The STI measurement structure 250 may include a STI structure 255, which can include a glass material. Metallic contacts 260 may be formed on, and in physical contact with, the STI structure 255. A gate electrode 265 may be formed on, and in physical contact with, the STI structure 255, and may include polysilicon material. In contrast to the gate electrode 225 in FIG. 2A, the gate electrode 265 is not formed on a gate dielectric layer, e.g., a thick oxide. This allows a measured leakage and breakdown voltage between the gate electrode 265 and the metallic contacts 260 to be about 100% from gate-to-diffusion without any gate dielectric influence.

In embodiments, a gate contact layer 270 can be formed on, and in physical contact with, the gate electrode 265, and can include a metal silicide layer. Gate sidewall spacers 275 may be formed on, and in physical contact with, the STI structure 255 and sidewalls of the gate electrode 265 and the gate contact layer 270. The gate sidewall spacers 275 may include a hardmask material, such as oxide or nitride. A dielectric layer 280 may be formed between, and in physical contact with, the gate sidewall spacers 275, and formed on, and in physical contact with, the STI structure 255. The dielectric layer 280 may include a silicon dioxide. A dielectric layer 285 may be formed between the metallic contacts 260 and over the gate of the STI measurement structure 250 (e.g., the gate contact layer 270, the gate sidewall spacers 275, and the dielectric layer 280). In embodiments, the dielectric layer 285 may include a silicon nitride.

In accordance with further aspects of the invention, the STI measurement structure 250 can be designed to include an excessive shift of the metallic contacts 260 in comparison to the respective original semiconductor structure to be evaluated. More specifically, in embodiments, each of the metallic contacts 260 may be designed to be shifted closer to the gate electrode 265 or farther from the gate electrode 265, in comparison to the original semiconductor structure. In embodiments, the shift of the metallic contacts 260 may be of one or more predetermined distances. The shift of the metallic contacts 260 may be designed while maintaining a pitch between the gate electrode 265 and one or more neighboring gate electrodes of STI measurement structures. The designed shift of the metallic contacts 260 allows for a more accurate measurement of leakage current and breakdown voltage between the gate electrode 265 and the metallic contacts 260. More specifically, the STI measurement structure 250 allows for a measured leakage current and a measured breakdown voltage between the gate electrode 265 and the metallic contacts 260 to not be dominated (e.g., overly affected) by a leakage and a breakdown voltage at the gate electrode 265.

Figure 2C:
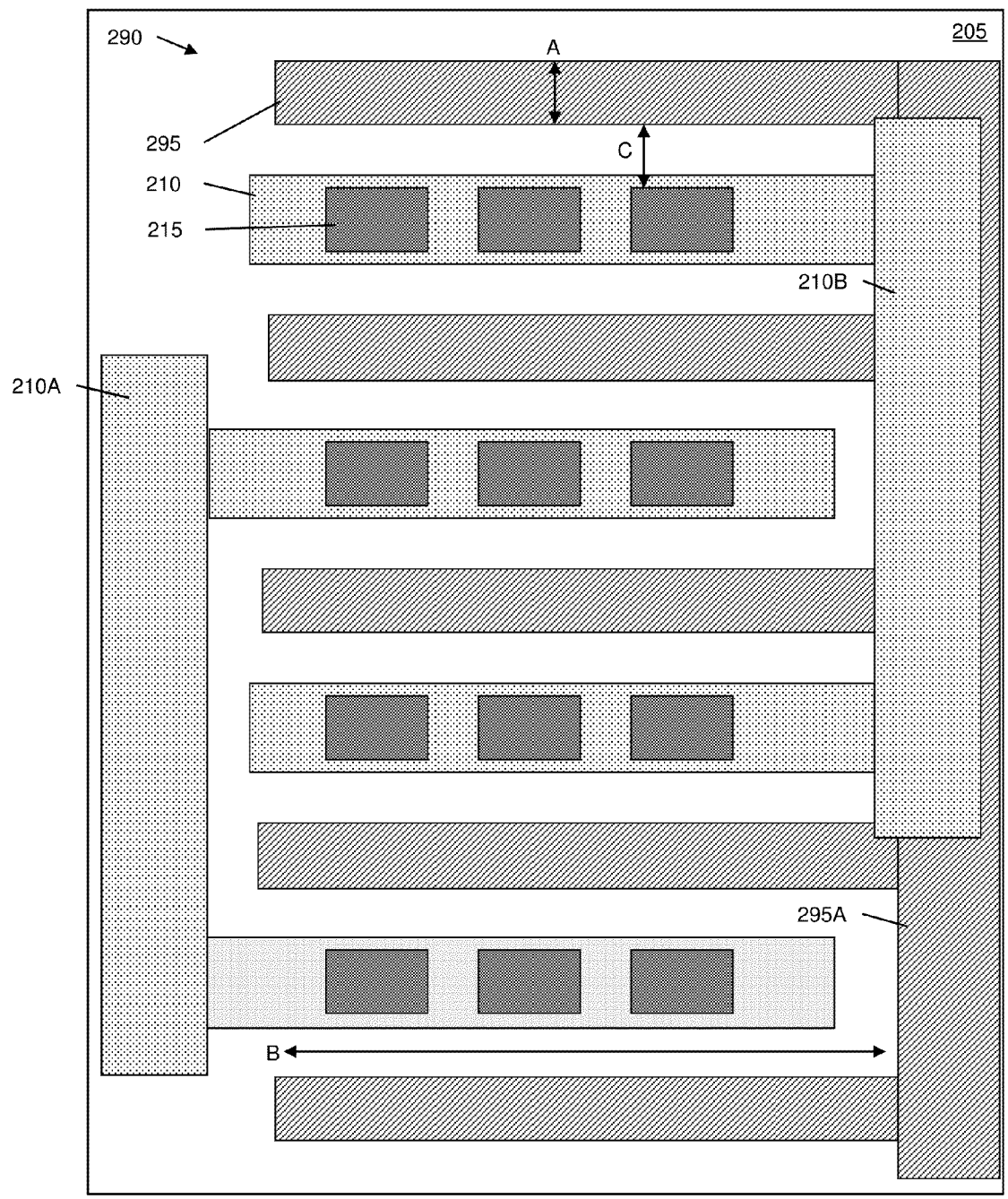
FIGS. 2C-2D are exemplary top views of an original semiconductor structure to be evaluated and the substrate measurement structure of FIG. 2A, respectively, in accordance with aspects of the invention.

Referring to FIG. 2C, an exemplary top view of an original semiconductor structure 290 to be evaluated is shown in accordance with aspects of the invention. In embodiments, the original semiconductor structure 290 can include the same components, such as the same silicon substrate 205, as the substrate measurement structure 200 in FIG. 2A. The source and drain regions 210 may be formed in the silicon substrate 205, and may be electrically and physically connected by a bottom diffusion contact 210A and/or a top diffusion contact 210B, respectively. The metallic contacts 215 may be formed on, and in physical contact with, the source and drain regions 210.

In embodiments, polysilicon gates 295 can be formed on, and in physical contact with, the silicon substrate 205, and each of the polysilicon gates 295 can include the same components as the polysilicon gate in FIG. 2A, e.g., the gate dielectric layer 220, the gate electrode 225, and the gate contact layer 230. Each of the polysilicon gates may be electrically and physically connected by a polysilicon contact 295A. Each of the polysilicon gates 295 may have a width A of about 40 nm, and a length B of about 1 µm, although other distances are contemplated by the invention. A space C between each of the polysilicon gates 295 and the respective metallic contact 215 may be about 25 nm, although other distances are contemplated by the invention. Although the original semiconductor structure 290 is shown here to include three terminals, one of ordinary skill in the art would recognize that the original semiconductor structure 290 may include two terminals (e.g., the bottom diffusion contact 210A and the top diffusion contact 210B tied together), four terminals (e.g., two of the polysilicon gates 295, the bottom diffusion contact 210A, and the top diffusion contact 210B tied together), etc.

Figure 2D:
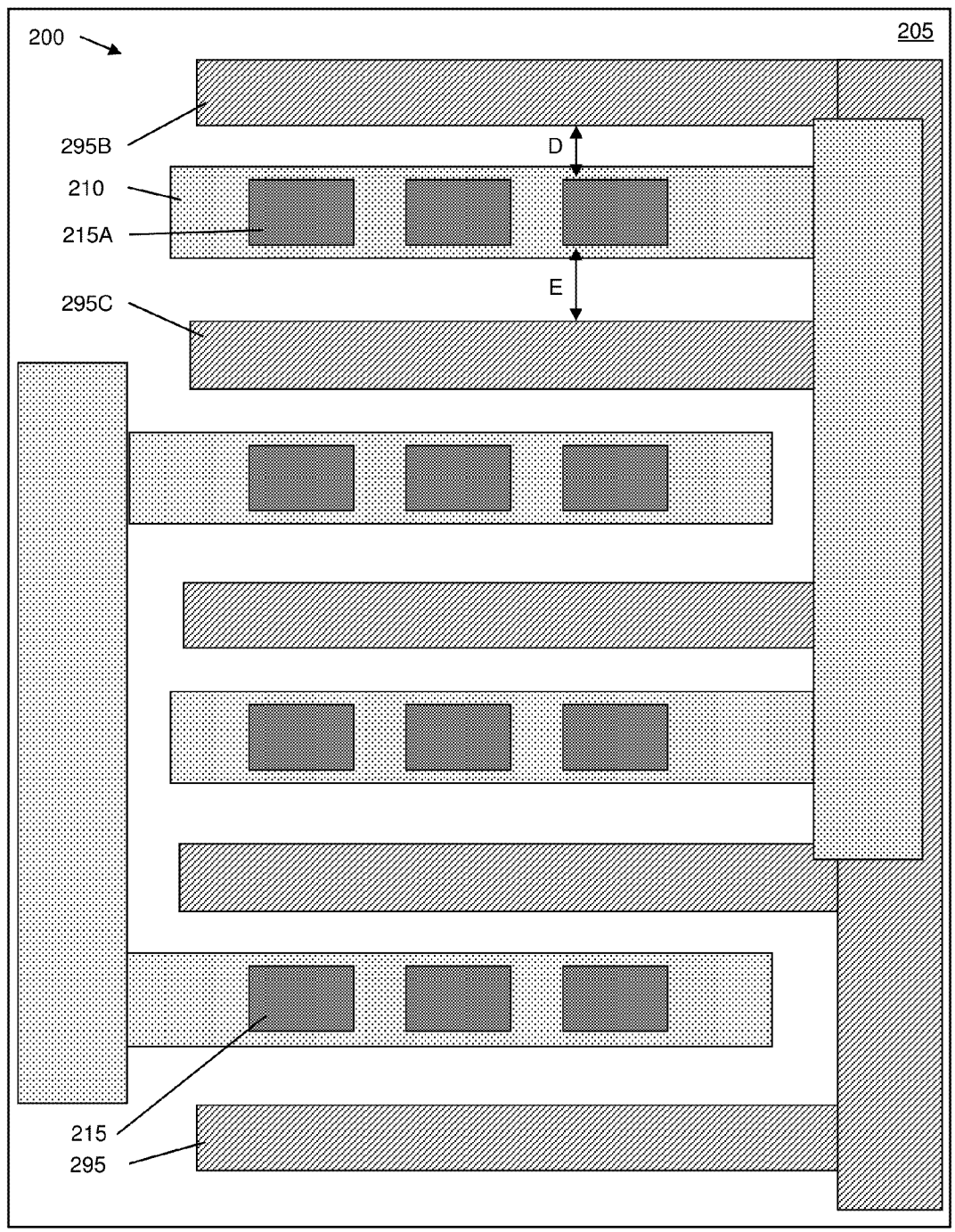

Referring to FIG. 2D, an exemplary top view of the substrate measurement structure 200 in FIG. 2A is shown in accordance with aspects of the invention. In embodiments, the substrate measurement structure 200 can be designed to include the same components as the original semiconductor structure 290 in FIG. 2C, and to include an excessive shift of the metallic contacts 215 in comparison to the original semiconductor structure 290. More specifically, in embodiments, each of the metallic contacts 215 may be designed to be shifted closer to one of the polysilicon gates 295 and farther from one of the polysilicon gates 295, in comparison to the original semiconductor structure 290. The shift of the metallic contacts 215 may be of one or more predetermined distances, e.g., in nanometers (nm).

For example, in embodiments, the shift of the metallic contacts 215 can be 5 nm in distance. Therefore, for example, a metallic contact 215A may be shifted 5 nm closer to a polysilicon gate 295B, and 5 nm farther from a polysilicon gate 295C. A space D between the polysilicon gate 295B and the shifted metallic contact 215A may be about 20 nm, and a space E between the polysilicon gate 295C and the shifted metallic contact 215A may be about 30 nm, although other distances are contemplated by the invention. The designed shift of the metallic contacts 215 allows for a more accurate measurement of leakage current and breakdown voltage between the polysilicon gates 295 and the metallic contacts 215. This top view of the substrate measurement structure 200 may be the same as a top view of a corresponding STI measurement structure (e.g., the STI measurement structure 250 in FIG. 2B), except that the silicon substrate 205 and the source and drain regions 210 would be substituted by a STI structure (e.g., the STI structure 255).

Figure 3:
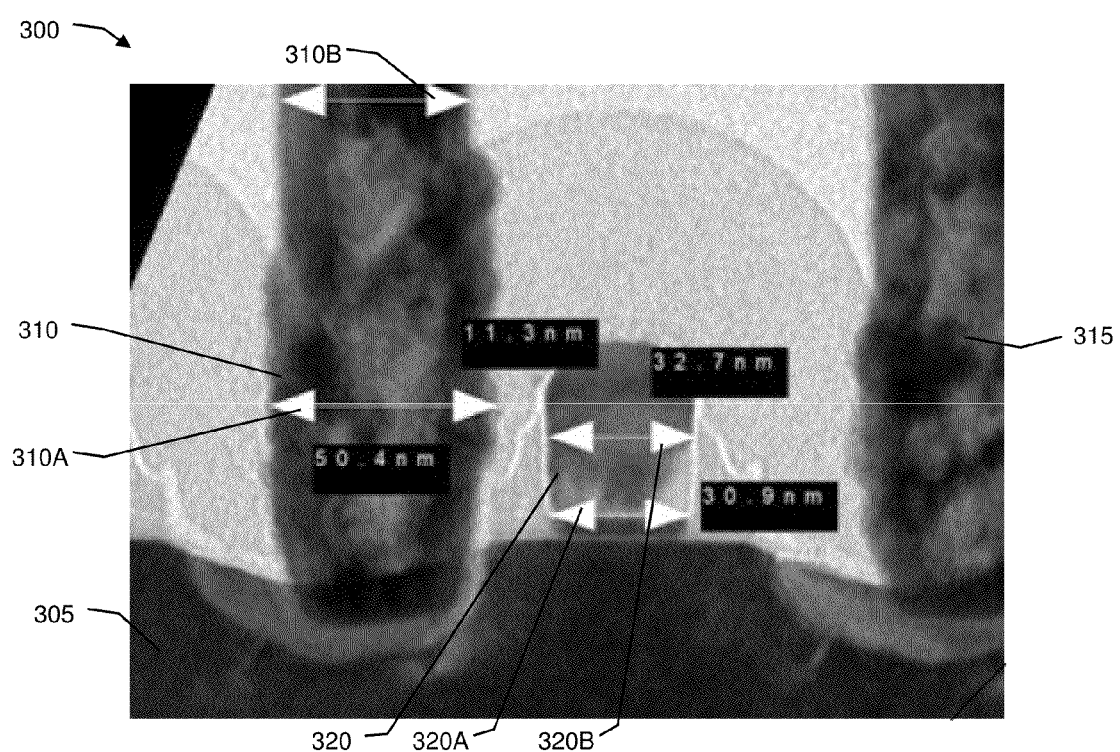
FIG. 3 is an exemplary cross-sectional view of a substrate measurement structure in accordance with aspects of the invention.

Referring to FIG. 3, an exemplary cross-sectional view of a substrate measurement structure 300 is shown in accordance with aspects of the invention. In embodiments, the substrate measurement structures 110 of FIG. 1 can include the substrate measurement structure 300. The substrate measurement structure 300 may include a silicon substrate 305. The substrate measurement structure 300 may further include metallic contacts 310 and 315 and a polysilicon control gate 320 that are formed over the silicon substrate 305. The polysilicon control gate 320 may be formed on a thick oxide, e.g., thicker than an oxide of the corresponding original semiconductor structure to be evaluated.

In embodiments, each of the metallic contacts 310 and 315 and the polysilicon control gate 320 can include varying widths at different locations. For example, the metallic contact 310 may include a first width 310A (e.g., of about 50 nm) at a first level closer to the polysilicon control gate 320, and a second width 310B at a second level farther from the polysilicon control gate 320. In another example, the polysilicon control gate 320 may include a first width 320A (e.g., about 30 nm) at a first level, and a second width 320B (e.g., about 32 nm) at a second level.

In accordance with further aspects of the invention, in addition to including a gate oxide thicker than that of the respective original semiconductor structure to be evaluated, the substrate measurement structure 300 can be designed to include an excessive shift of the metallic contacts 310 and/or 315 in comparison to the respective semiconductor structure. More specifically, in embodiments, each of the metallic contacts 310 and 315 may be designed to be shifted closer to the polysilicon control gate 320 or farther from the polysilicon control gate 320, in comparison to the original semiconductor structure. For example, the metallic contact 310 may be designed to be shifter closer to (e.g., about 11 nm away from) the polysilicon control gate 320, while the metallic contact 315 may be designed to be shifter farther from the polysilicon control gate 320. In this example, an original spacing (e.g., a ground rule in an originally-designed semiconductor structure) between the polysilicon control gate 320 and the metallic contact 310 gate may be a predetermined value (e.g., about 25 nm), and the shift of the metallic contact 310 may be a predetermined value (e.g., about 14 nm) closer to the polysilicon control gate 320. This results in a final spacing between the polysilicon control 320 and the metallic contact 310 gate being a particular value, e.g., about 11 nm.

In embodiments, the shift of the metallic contacts 310 and 315 can be designed while maintaining a pitch between the polysilicon control gate 320 and one or more neighboring polysilicon control gates of substrate measurement structures. The designed shift of the metallic contacts 310 and 315 allows for a more accurate measurement of leakage current and breakdown voltage between the polysilicon control gate 320 and the metallic contacts 310 and 315. More specifically, the substrate measurement structure 300 allows for a measured leakage current and a measured breakdown voltage between the polysilicon control gate 320 and the metallic contact 310 or 315 to not be dominated (e.g., overly affected) by a leakage and a breakdown voltage at the polysilicon control gate 320.

Figure 4A:
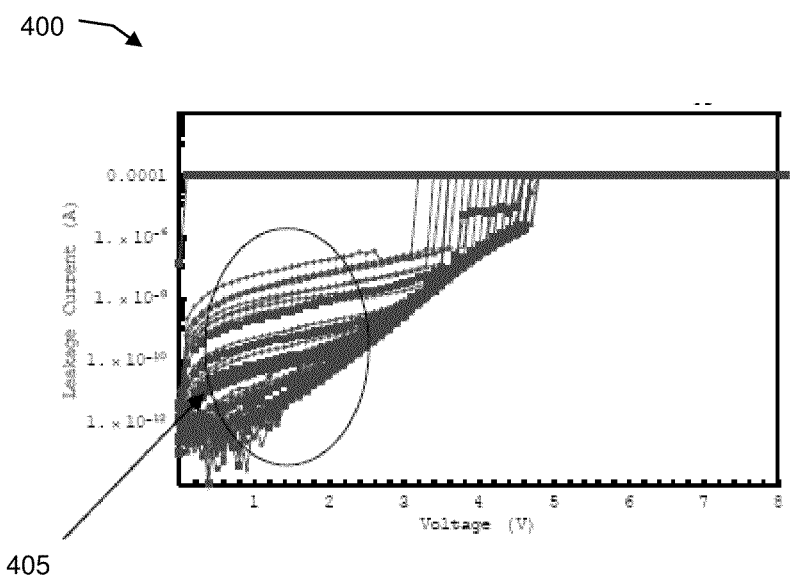
FIGS. 4A-4B are exemplary graphs of leakage current per voltage in substrate measurement structures in accordance with aspects of the invention.

Referring to FIG. 4A, an exemplary graph 400 of leakage current per voltage in substrate measurement structures (e.g., the substrate measurement structures 110 in FIG. 1) is shown in accordance with aspects of the invention. More specifically, in embodiments, the graph 400 shows leakage current per voltage measured between a control gate and a contact, of each substrate measurement structure, where the contact is shifted about 15 nm farther from the control gate. Due to these shifts, the measurements of the leakage currents and the voltages between each control gate and contact is more accurate in that curves 405 of the graph 400 show smooth, approximately linear relationships between the measured leakage currents and voltages. That is, the substrate measurement structures, with contacts shifted 15 nm farther from their respective control gates, allow the measured leakage current and voltages between these components to not be dominated (e.g., overly affected) by the leakage and the breakdown voltage at the control gates.

Figure 4B:
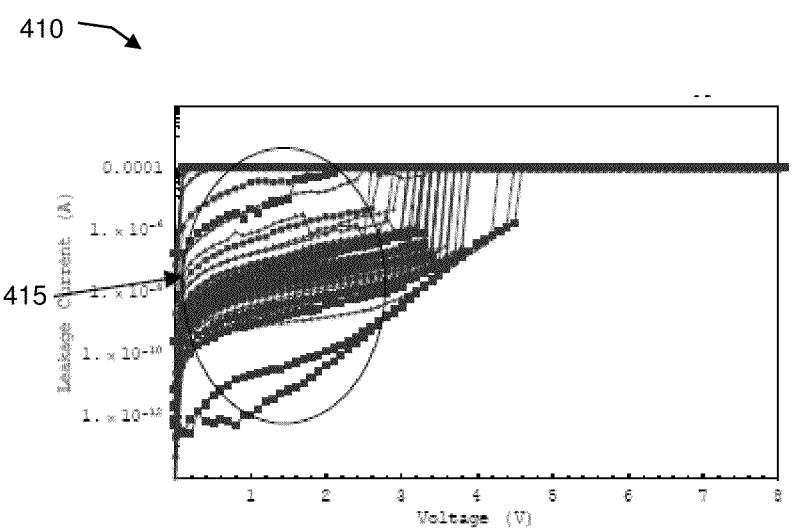

Referring to FIG. 4B, an exemplary graph 410 of leakage current per voltage in substrate measurement structures (e.g., the substrate measurement structures 110 in FIG. 1) is shown in accordance with aspects of the invention. More specifically, in embodiments, the graph 410 shows leakage current per voltage measured between a control gate and a contact, of each substrate measurement structure, where the contact is shifted about 15 nm closer to the control gate. Due to these shifts, the measurements of the leakage currents and the voltages between each control gate and contact is more accurate in that curves 415 of the graph 410 show smooth, approximately linear relationships between the measured leakage currents and voltages. That is, the substrate measurement structures, with contacts shifted 15 nm closer to their respective control gates, allow the measured leakage current and voltages between these components to not be dominated (e.g., overly affected) by the leakage and the breakdown voltage at the control gates.

Figure 5A:
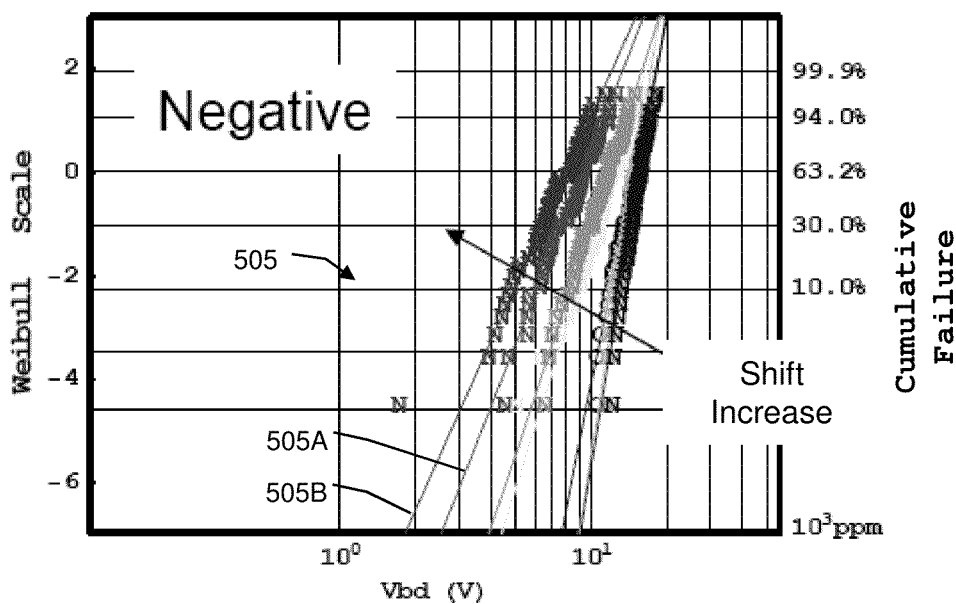
FIGS. 5A-5B are exemplary graphs of cumulative failure per breakdown voltage in STI measurement structures in accordance with aspects of the invention.

FIG. 5A is an exemplary graph 500 of cumulative failure per breakdown voltage in STI measurement structures (e.g., the STI measurement structures 115 in FIG. 1) in accordance with aspects of the invention. More specifically, in embodiments, the graph 500 shows an approximately linear relationship between the cumulative failure and the breakdown voltage in STI measurement structures. Further, the graph 500 shows a plurality of curves 505, each of which represent cumulative failure per breakdown voltage in a single STI measurement structure with a predetermined shift (e.g., a negative shift) of a contact farther away from a control gate, in comparison a respective original semiconductor structure to be evaluated. As shown by the curves 505, as a shift increases (in absolute value) for each STI measurement structure, corresponding breakdown voltages decrease.

For example, curve 505A represents cumulative failure per breakdown voltage in a first STI measurement structure with a predetermined shift (e.g., of −4 nm) of a contact farther away from a control gate. In contrast, curve 505B represents cumulative failure per breakdown voltage in a second STI measurement structure with a greater predetermined shift (e.g., of −5 nm) of a contact farther away from a control gate. As shown by the curves 505A and 505B, since the curve 505B represents the second STI measurement structure with the greater shift, corresponding breakdown voltages of the curve 505B are less than breakdown voltages of the curve 505A. In embodiments, the structure evaluation tool 105 in FIG. 1 may use each of the breakdown voltages of the curves 505 to determine a minimum space between a control gate and a contact in each STI measurement structure.

Figure 5B:
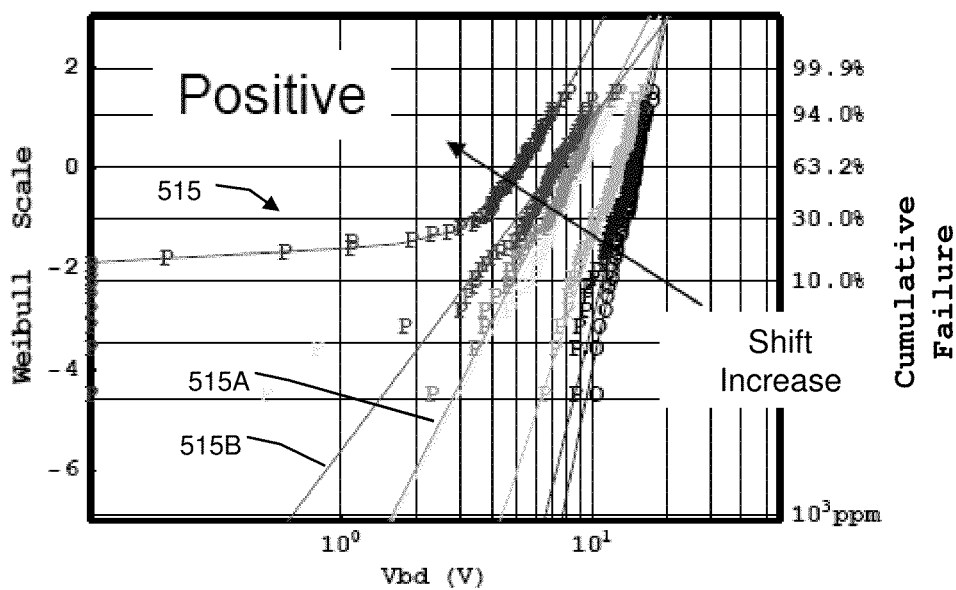

FIG. 5B is an exemplary graph 510 of cumulative failure per breakdown voltage in STI measurement structures (e.g., the STI measurement structures 115 in FIG. 1) in accordance with aspects of the invention. More specifically, in embodiments, the graph 510 shows an approximately linear relationship between the cumulative failure and the breakdown voltage in STI measurement structures. Further, the graph 510 shows a plurality of curves 515, each of which represent cumulative failure per breakdown voltage in a single STI measurement structure with a predetermined shift (e.g., a positive shift) of a contact closer to a control gate, in comparison an respective original semiconductor structure to be evaluated. As shown by the curves 515, as a shift increases (in absolute value) for each STI measurement structure, corresponding breakdown voltages decreases.

For example, curve 515A represents cumulative failure per breakdown voltage in a first STI measurement structure with a predetermined shift (e.g., of 4 nm) of a contact closer to a control gate. In contrast, curve 515B represents cumulative failure per breakdown voltage in a second STI measurement structure with a greater predetermined shift (e.g., of 5 nm) of a contact closer to a control gate. As shown by the curves 515A and 515B, since the curve 515B represents the second STI measurement structure with the greater shift, corresponding breakdown voltages of the curve 515B are less than breakdown voltages of the curve 515A. In embodiments, the structure evaluation tool 105 in FIG. 1 may use each of the breakdown voltages of the curves 515 to determine a minimum space between a control gate and a contact in each STI measurement structure.

Figure 5C:
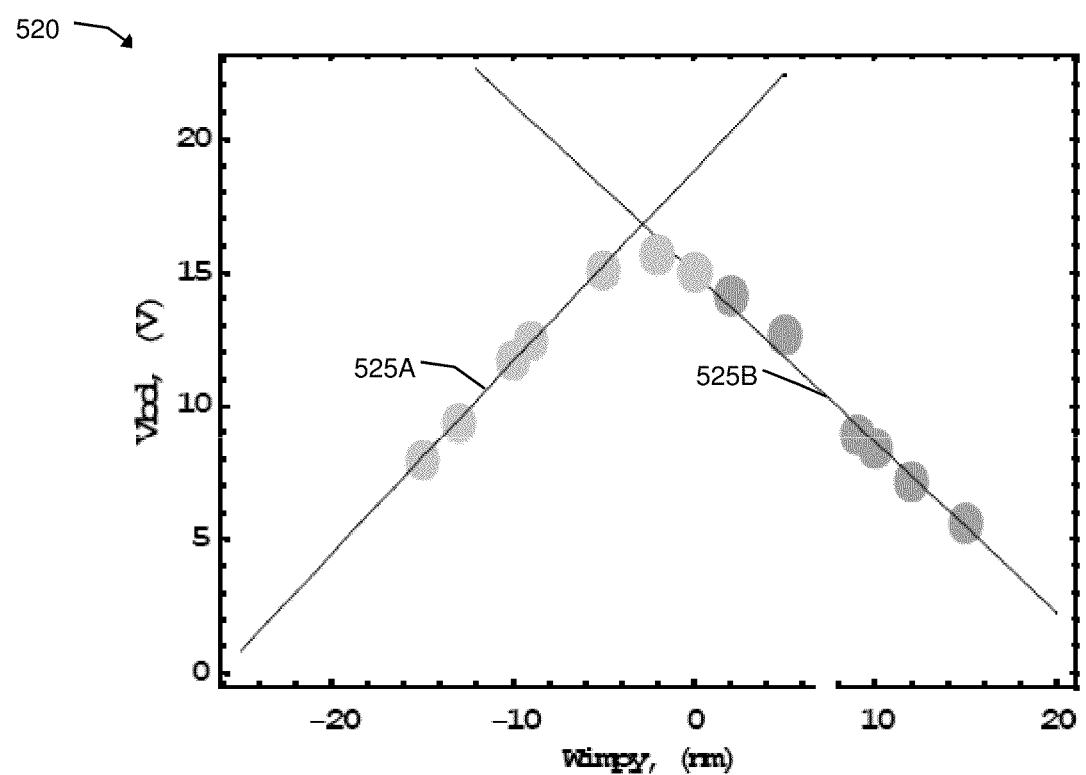
FIG. 5C is an exemplary graph of breakdown voltage per contact shift in STI measurement structures in accordance with aspects of the invention.

FIG. 5C is an exemplary graph 520 of breakdown voltage per contact shift in STI measurement structures (e.g., the STI measurement structures 115 in FIG. 1) in accordance with aspects of the invention. More specifically, in embodiments, the graph 520 shows that as a shift of a contact in the STI measurement structures (e.g., "Wimpy") increases in absolute value, a corresponding breakdown voltage decreases. For example, the graph 520 includes line 525A which shows that as the contact shift becomes more negative in value (e.g., increases in absolute value), the breakdown voltage decreases. The graph 520 also includes line 525B which shows that as the contact shift becomes more positive in value (e.g., increases in absolute value), the breakdown voltage also decreases. The lines 525A and 525B intersect at a point which represents an actual contact shift (e.g., overlay shift) in the original semiconductor structures to be evaluated, due to process effects. This point may be used to determine variation from design-to-fabrication of the original semiconductor structures, due to such process effects.

Figure 6A:
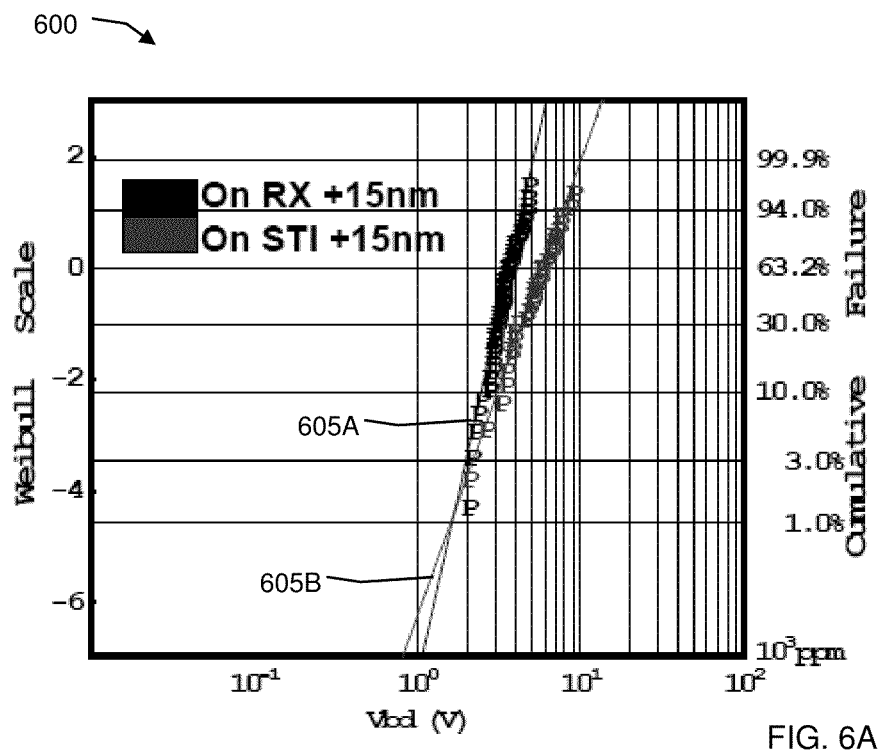
FIG. 6A is an exemplary graph of cumulative failure per breakdown voltage in substrate and STI measurement structures in accordance with aspects of the invention.

FIG. 6A is an exemplary graph 600 of cumulative failure per breakdown voltage in substrate and STI measurement structures (e.g., the substrate and STI measurement structures 110 and 115 in FIG. 1) in accordance with aspects of the invention. The graph 600 includes a first curve 605A which represents cumulative failure per breakdown voltage in substrate measurement structures, each of which includes a predetermined contact shift (e.g., 15 nm) closer to a respective control gate. The graph 600 further includes a second curve 605B which represents cumulative failure per breakdown voltage in STI measurement structures, each of which includes a predetermined contact shift (e.g., 15 nm) closer to a respective control gate. Even for a same or similar fabrication process and contact shift, gate-to-contact alignment and distribution in the substrate and STI measurement structures may be different, and thus, the cumulative failure per breakdown voltage in the substrate and STI measurement structures may be different, as shown herein. For example, the substrate measurement structures may have more spatial shift but tighter space distribution than the STI measurement structures for a same nominal design of the measurement structures. However, at a lower percentile, which is mostly related to reliability, no difference between the substrate and STI measurement structures may be found. In embodiments, the structure evaluation tool 105 in FIG. 1 may use each of the breakdown voltages of the curves 605A and 605B to determine a minimum space between a control gate and a contact in each of the substrate and STI measurement structures.

Figure 6B:
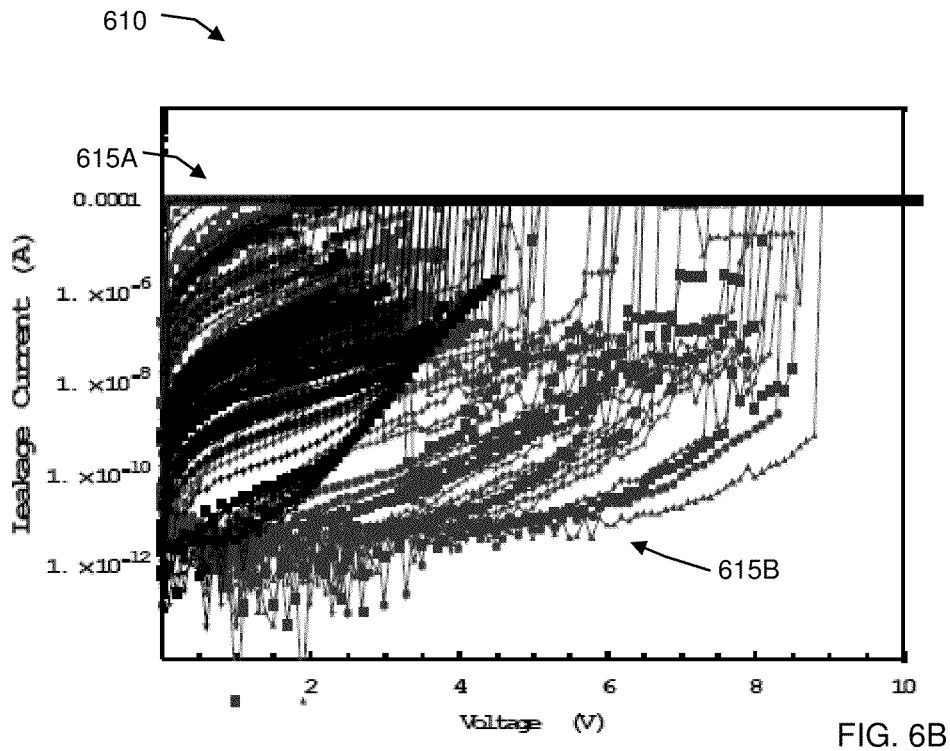
FIG. 6B is an exemplary graph of leakage current per voltage in substrate and STI measurement structures in accordance with aspects of the invention.

FIG. 6B is an exemplary graph 610 of leakage current per voltage in substrate and STI measurement structures (e.g., the substrate and STI measurement structures 110 and 115 in FIG. 1) in accordance with aspects of the invention. More specifically, in embodiments, the graph 610 includes a plurality of curves 615A which show leakage current per voltage measured between a control gate and a contact, of each substrate measurement structure, where the contact is shifted about 15 nm closer to the control gate. The graph 610 further includes a plurality of curves 615B which show leakage current per voltage measured between a control gate and a contact, of each STI measurement structure, where the contact is shifted about 15 nm closer to the control gate. Even for a same or similar fabrication process and contact shift, the leakage current per voltage measured in the substrate and STI measurement structures may be different, as shown herein.

Figure 7:
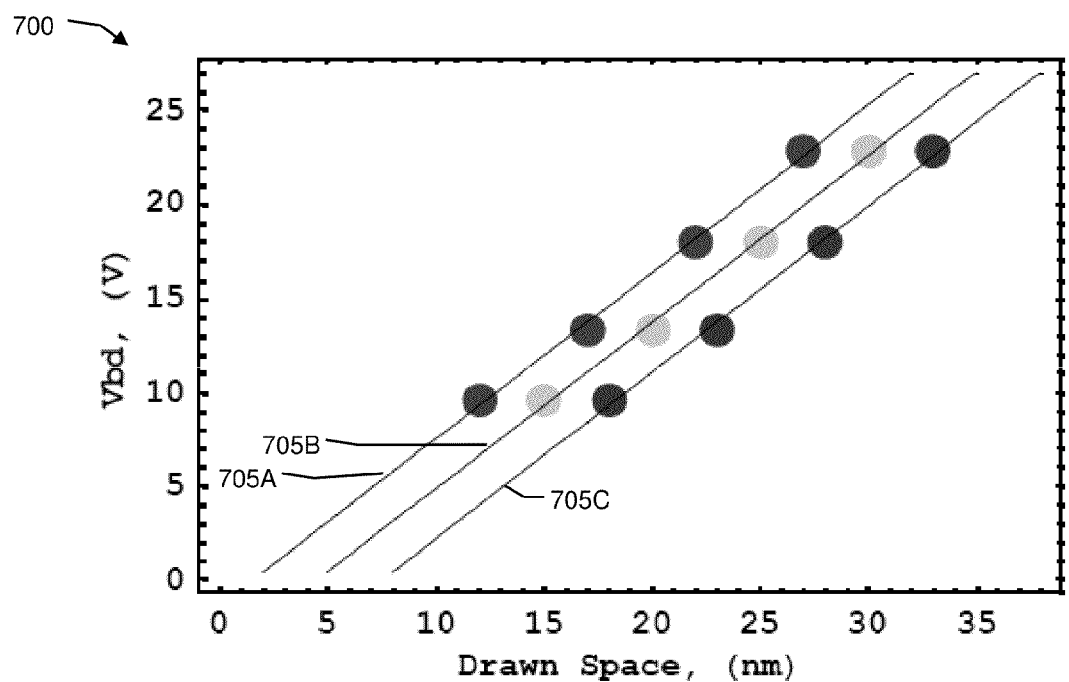
FIG. 7 is an exemplary graph of breakdown voltage per minimum space in STI measurement structures in accordance with aspects of the invention.

FIG. 7 is an exemplary graph 700 of breakdown voltage per minimum space in STI measurement structures (e.g., the STI measurement structures 115 in FIG. 1) in accordance with aspects of the invention. In embodiments, the minimum space in the STI measurement structures can be determined (by the structure evaluation tool 105) based on a breakdown electrical field measured in each of the STI measurement structures (e.g., between a contact and a control gate) and a breakdown voltage measured in each corresponding substrate measurement structure, as discussed above. As shown in the graph 700, the breakdown voltage and the minimum space in the STI measurement structures have an approximately linear relationship.

In embodiments, the graph 700 includes a first curve 705A, a second curve 705B, and a third curve 705C. The first curve 705A shows breakdown voltage per minimum space in STI measurement structures with a contact shift of −3 nm, e.g., where each contact is shifted 3 nm farther from a control gate. The second curve 705B shows breakdown voltage per minimum space in STI measurement structures with no contact shift. The third curve 705C shows breakdown voltage per minimum space in STI measurement structures with a contact shift of 3 nm, e.g., where each contact is shifted 3 nm closer to a control gate. The almost identical slopes of each curve represent a common material property, e.g., dielectric breakdown strength. The different intercepts at the x-axis of the graph 700 (e.g., the minimum space) represent the different actual shifts caused by processing, which could be different from as-design values such as −3 nm, 0 nm and +3 nm.

Figure 8A:
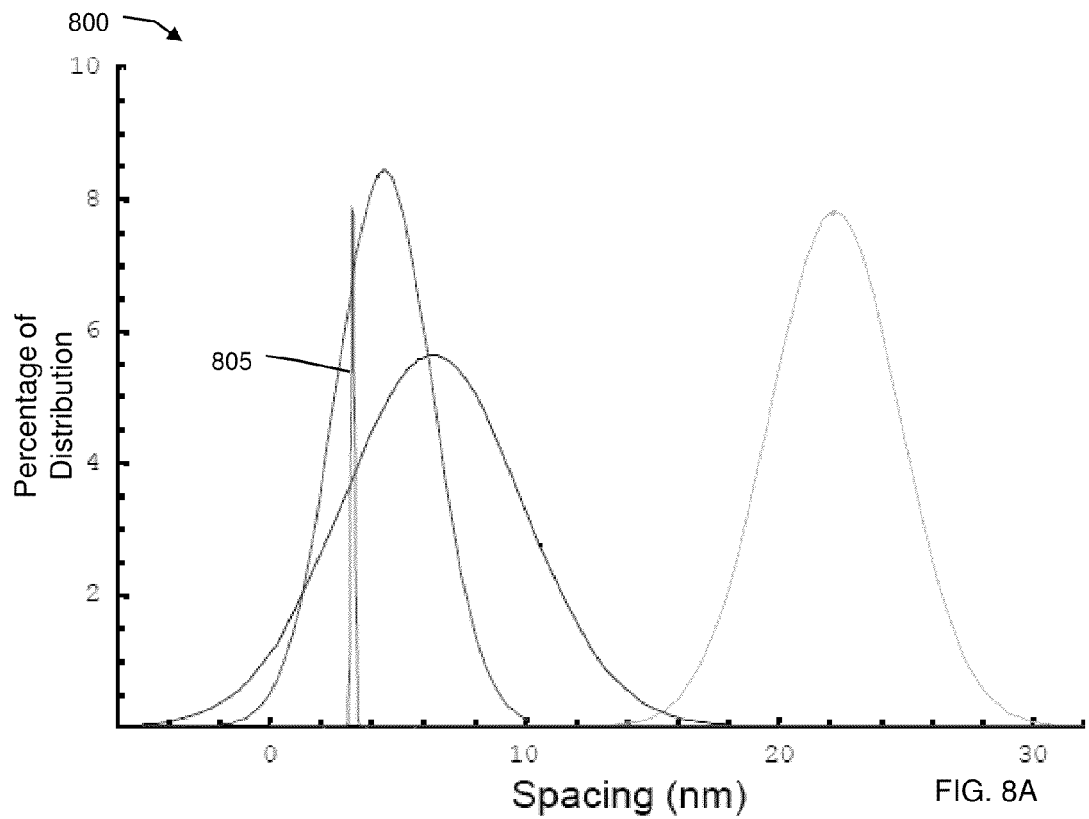
FIGS. 8A-8B are exemplary graphs of space distributions of substrate and STI measurement structures in accordance with aspects of the invention.

FIG. 8A is an exemplary graph 800 of space distributions of substrate and STI measurement structures (e.g., the substrate and STI measurement structures 110 and 115 in FIG. 1) in accordance with aspects of the invention. In embodiments, the space distributions (e.g., statistical distributions) can include a percentage of distribution per measured spacing (e.g., a minimum space) between each contact and control gate in the substrate and STI measurement structures. The space distributions may be determined (by the structure evaluation tool 105) based on measured breakdown electrical fields in the STI measurement structures and measured breakdown voltages in the substrate measurement structures, as discussed above. Each of the space distributions may be determined based on measurements taken in, e.g., approximately 1,200 respective measurement structures. The graph 800 further includes a curve 805 which represents a gate dielectric thickness distribution of the substrate and STI measurement structures.

Figure 8B:
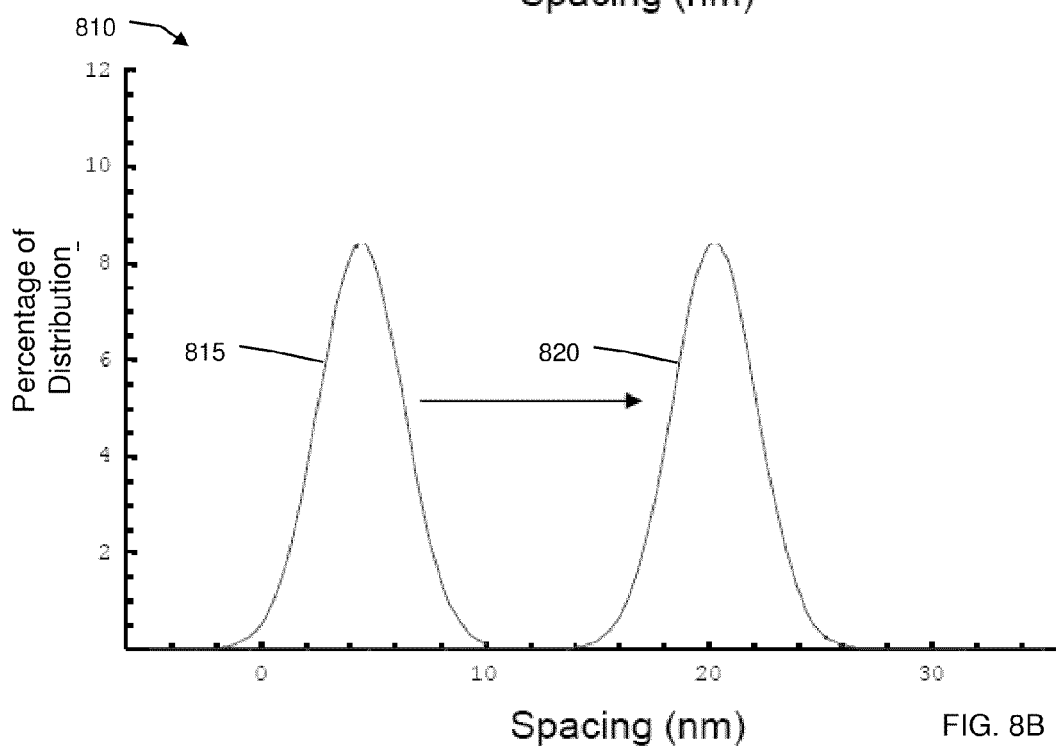

FIG. 8B is an exemplary graph 810 of space distributions of substrate measurement structures (e.g., the substrate measurement structures 110 in FIG. 1) in accordance with aspects of the invention. More specifically, in embodiments, a first curve 815 can include a space distribution of the substrate measurement structures with a contact shift of 15 nm closer to respective control gates. To determine a space distribution of original semiconductor structures to be evaluated without a contact shift, the first curve 815 may be shifted by 15 nm, resulting in a second curve 820 which represents the space distribution of the original semiconductor structures. The second curve 820 may have a mean of 19.5 nm, and a standard deviation of 1.9 nm which is assumed to be the same as the standard deviation of the first curve 815 for the substrate measurement structures with a contact shift of 15 nm. In embodiments, the shift of the first curve 815 may be performed by the structure evaluation tool 105 in FIG. 1.

Figure 9A:
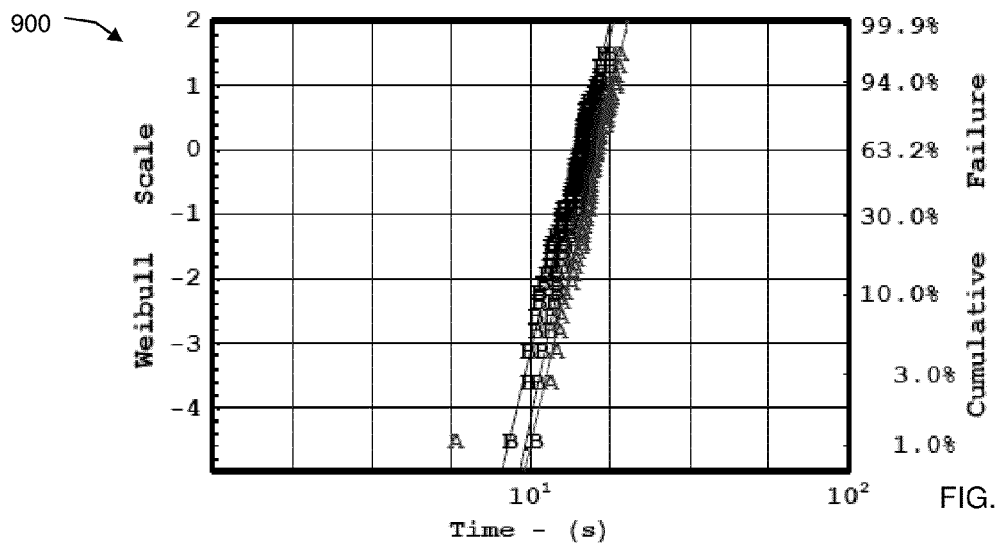
FIG. 9A is an exemplary graph of cumulative failure per time in STI measurement structures in accordance with aspects of the invention.

FIG. 9A is an exemplary graph 900 of cumulative failure per time in STI measurement structures (e.g., the STI measurement structures 115 in FIG. 1) in accordance with aspects of the invention. More specifically, in embodiments, the graph 900 shows the cumulative failure per the time in three STI measurement structures with no contact shift and with three different respective design areas, e.g., a design area ratio of 1:10:100. The graph 900 further shows that the cumulative failure and the time have an approximately linear relationship.

Figure 9B:
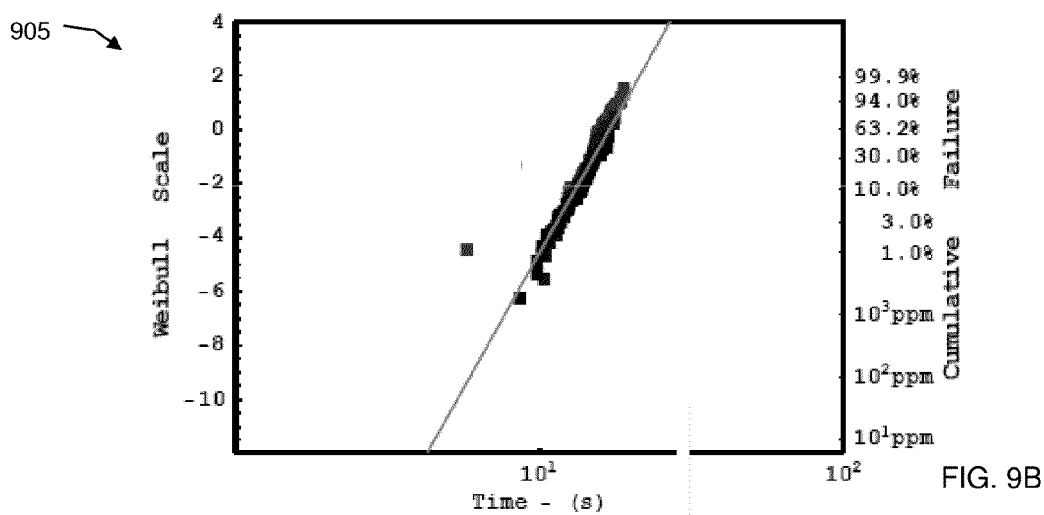
FIG. 9B is an exemplary graph of cumulative failure per time, scaled by a fatal area ratio, in the STI measurement structures in accordance with aspects of the invention.

FIG. 9B is an exemplary graph 905 of cumulative failure per time, scaled by a fatal area ratio, in the STI measurement structures (e.g., the STI measurement structures 115 in FIG. 1) in accordance with aspects of the invention. More specifically, in embodiments, the graph 905 shows the scaled cumulative failure per the time in the three STI measurement structures when their design areas are scaled by three different respective fatal areas, e.g., a fatal area ratio of 1:3:6. The fatal areas may be determined by a structure evaluation tool (e.g., the structure evaluation tool 105 of FIG. 1) when, for example, a contact in a structure is fatally defective. The graph 905 further shows that the scaled cumulative failure and the time have an approximately linear relationship.

Figure 9C:
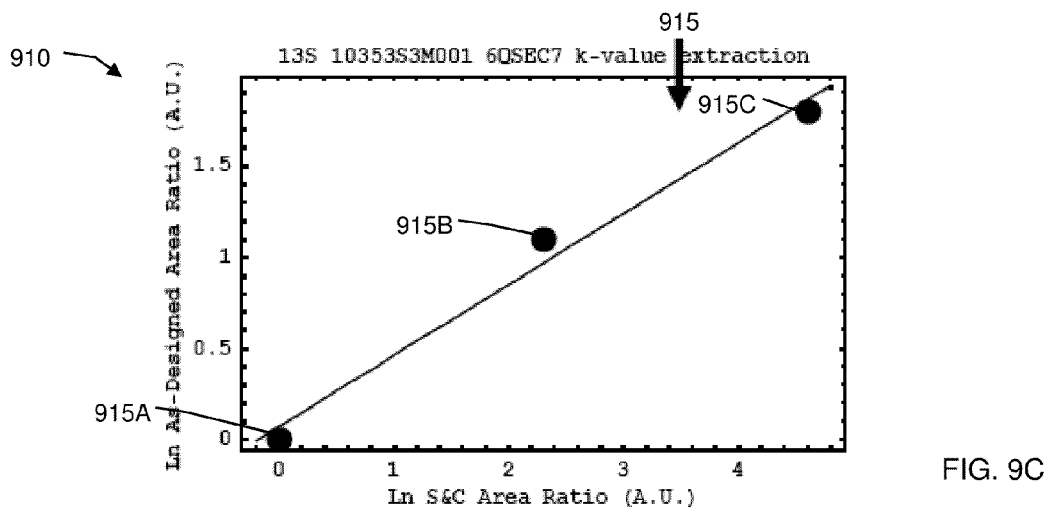
FIG. 9C is an exemplary graph of design area ratio versus fatal area ratio in the STI measurement structures in accordance with aspects of the invention.

FIG. 9C is an exemplary graph of design area ratio versus fatal area ratio in the STI measurement structures (e.g., the STI measurement structures 115 in FIG. 1) in accordance with aspects of the invention. More specifically, in embodiments, the graph 910 shows line 915 which represents a linear relationship between the design area ratio (e.g., 1:10:100) and the fatal area ratio (e.g., 1:3:6) in the three STI measurement structures. The line 915 includes a first point 915A, a second point 915B, and a third point 915C, which each represent the design area ratio versus the fatal area ratio of a respective one of the three STI measurement structures. A slope of the line 915 may be determined (e.g., extracted by the structure evaluation tool 105) to represent a coefficient k to determine the scaled cumulative failure of the three STI measurement structures. In this case, the slope of the line 915 is about 0.4 in value.

Figure 10:
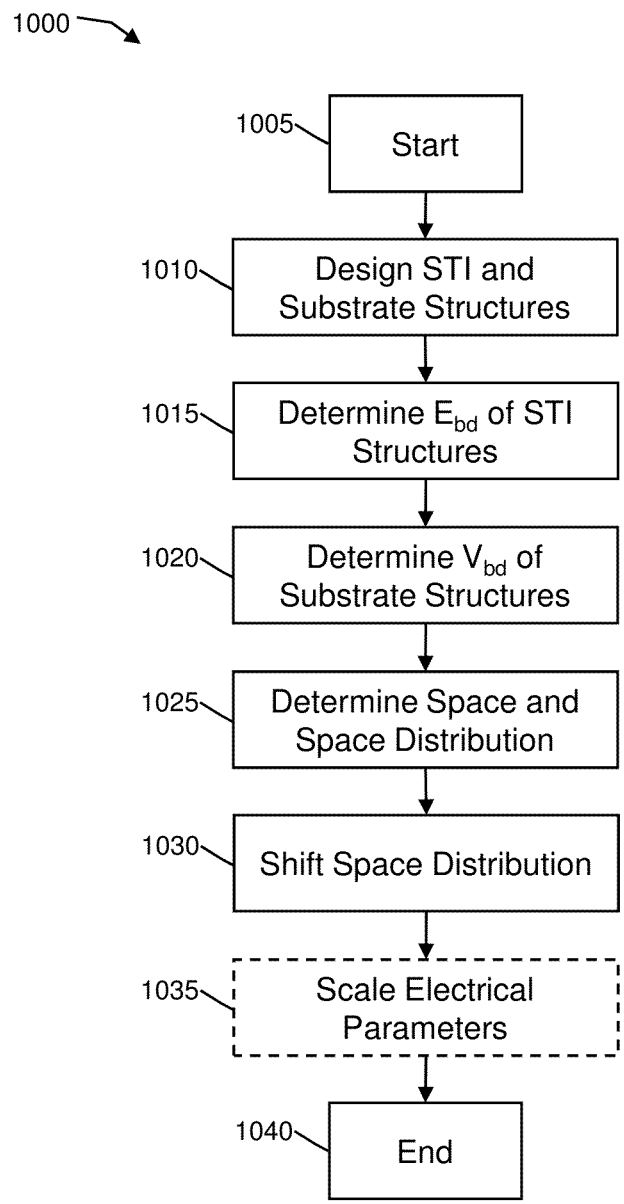
FIG. 10 is an exemplary flow diagram of processes of on-chip poly-to-contact process monitoring and reliability evaluation in accordance with aspects of the invention.

FIG. 10 shows an exemplary flow for performing steps of processes of on-chip poly-to-contact process monitoring and reliability evaluation in accordance with aspects of the invention. The steps of FIG. 10 may be implemented in the environment of FIG. 1, for example. The flowchart and block diagrams in the Figure illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

FIG. 10 depicts an exemplary flow for a process 1000 of poly-to-contact process monitoring and reliability evaluation in accordance with aspects of the invention. In embodiments, the process 1000 can be performed by the structure evaluation tool 105 in FIG. 1. At step 1005, the process starts. At step 1010, the structure evaluation tool designs a set of one or more substrate measurement structures (e.g., the substrate measurement structures 110) and one or more shallow trench isolation (STI) measurement structures (e.g., the STI measurement structures 115). These measurement structures are used to determine realistic electrical parameters (e.g., a breakdown voltage, a breakdown electric field, etc.) of originally-designed one or more semiconductor structures (e.g., MOSFETs) to be evaluated.

At step 1015, the structure evaluation tool 105 uses the STI measurement structures to determine a breakdown electrical field ($E_{bd}$) of each of the STI measurement structures. At step 1020, the structure evaluation tool uses the substrate measurement structures to determine a realistic breakdown voltage ($V_{bd}$) of each of the substrate measurement structures. At step 1025, based on the determined breakdown electrical field of the STI measurement structures and the determined breakdown voltage of the substrate measurement structures, the structure evaluation tool determines a minimum space (e.g., a worst-case space) for each of the original semiconductor structures to be evaluated. The structure evaluation tool further determines a space distribution which includes a percentage of distribution of the determined minimum spaces of the original semiconductor structures.

At step 1030, the structure evaluation tool shifts the determined space distribution by one or more known shift values of contacts in the substrate and STI measurement structures, to determine a ground rule (e.g., nominal case) space distribution of the original semiconductor structures (e.g., whose contacts are not shifted). At optional step 1035, the structure evaluation tool uses a fatal area ratio and a design area ratio of each of the original semiconductor structures to scale (e.g., more accurately determine) one or more electrical parameters (e.g., a cumulative failure, a breakdown voltage, etc.) of each of the original semiconductor structures. At step 1040, the process ends.

Figure 11:
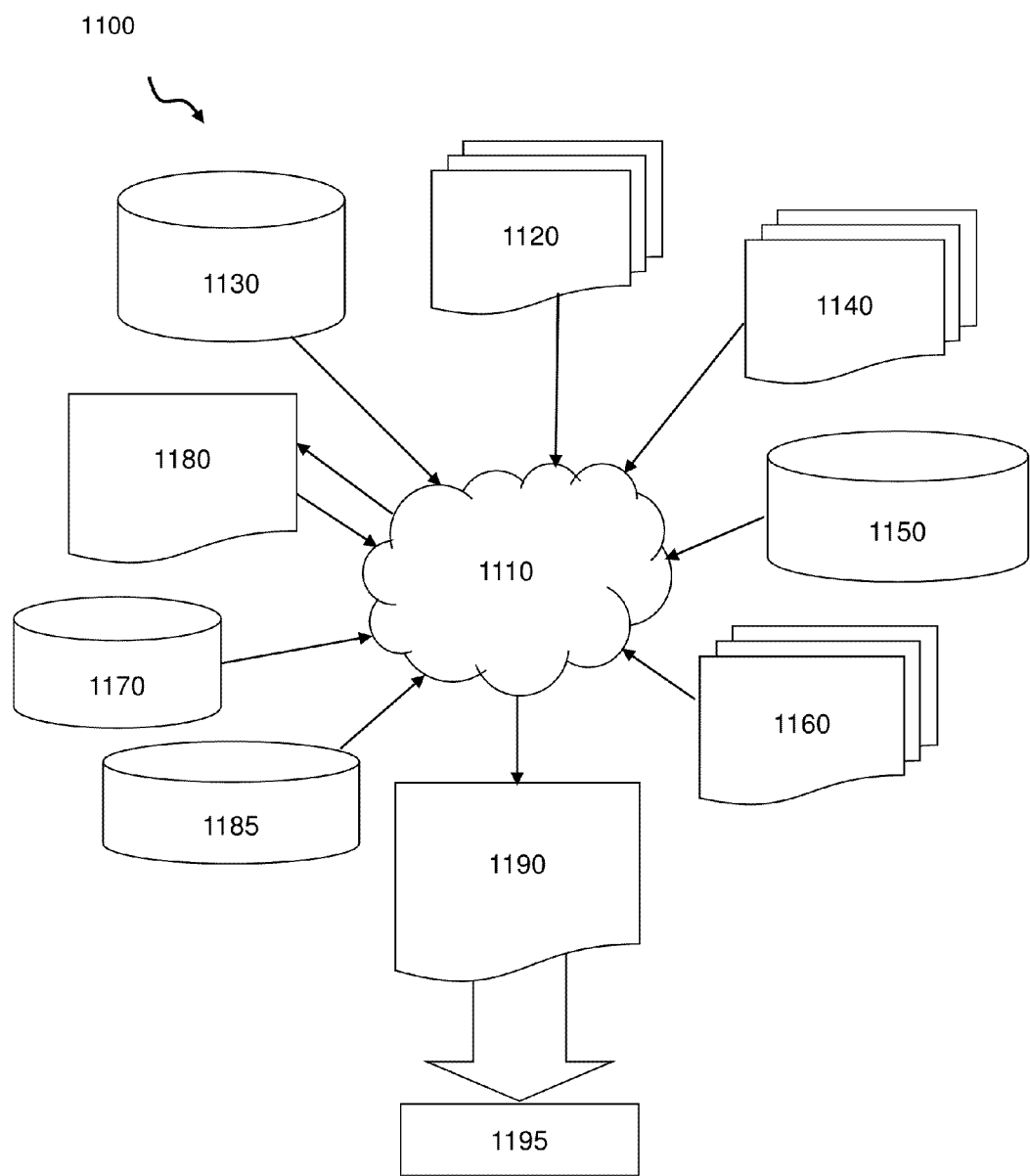
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices described above and shown in FIGS. 2A-3. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 2A-3. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 2A-3 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190.

Design structure 1190 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2A-3. In one embodiment, design structure 1190 may comprise a compiled, executable HDL simulation model that functionally simulates the devices shown in FIGS. 2A-3.

Design structure 1190 may also employ a data format used for the exchange of layout data of integrated circuits and/or symbolic data format (e.g., information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2A-3. Design structure 1190 may then proceed to a stage 1195 where, for example, design structure 1190: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    determining a breakdown electrical field of each of one or more shallow trench isolation (STI) measurement structures corresponding to respective one or more original semiconductor structures;
    determining a breakdown voltage of each of one or more substrate measurement structures corresponding to the respective one or more original semiconductor structures; and
    determining a space between a gate and a contact of each of the one or more original semiconductor structures based on the determined breakdown electrical field and the determined breakdown voltage.

2. The method of claim 1, further comprising designing each of the one or more STI measurement structures to comprise the contact and the gate, on a STI structure, the contact being shifted one of closer to and farther from the gate in comparison to the respective one of the one or more original semiconductor structures.

3. The method of claim 1, further comprising designing each of the one or more substrate measurement structures to comprise the contact and the gate, on a substrate, the contact being shifted one of closer to and farther from the gate in comparison to the respective one of the one or more original semiconductor structures.

4. The method of claim 1, wherein the space is determined based on the following equation:

$$x_{eff1} = \frac{V_{bd}}{E_{bd}},$$

where $x_{eff1}$ is the space, $V_{bd}$ is the determined breakdown voltage, and $E_{bd}$ is the determined breakdown electrical field.

5. The method of claim 1, wherein the space is determined based on the following equation:

$$x_{eff2} = x_{drawn} - dx_{bias},$$

where $x_{eff2}$ is the space, $x_{drawn}$ is a drawn space in the respective one of the one or more original semiconductor structures, and $dx_{bias}$ is a measured contact shift in the respective one of the one or more STI and substrate measurement structures.

6. The method of claim 1, further comprising determining a space distribution for each of the one or more original semiconductor structures based on the determined space.

7. The method of claim 6, further comprising determining at least one of a mean and a standard deviation of the space distribution.

8. The method of claim 6, further comprising shifting the determined space distribution by one or more predetermined contact shifts in the one or more STI and substrate measurement structures.

9. The method of claim 1, further comprising scaling electrical parameters of at least one of the one or more original semiconductor structures, the one or more STI measurement structures, and the one or more substrate measurement structures based on a fatal area ratio and a design area ratio, of the one or more original semiconductor structures.

10. The method of claim 9, further comprising determining the fatal area ratio based on the determined space of each of the one or more original semiconductor structures and whether the determined space is less than a predetermined threshold.

11. A method of poly-to-contact process monitoring and reliability evaluation, comprising:

determining a breakdown electrical field of one or more shallow trench isolation (STI) measurement structures corresponding to respective one or more original semiconductor structures;

determining a breakdown voltage of one or more substrate measurement structures corresponding to the respective one or more original semiconductor structures; and determining a space distribution of spacing between a gate and a contact of each of the one or more original semiconductor structures based on the determined breakdown electrical field and the determined breakdown voltage.

12. The method of claim 11, further comprising designing each of the one or more STI measurement structures to comprise the contact and the gate, on a STI structure, the contact being shifted one of closer to and farther from the gate in comparison to the respective one of the one or more original semiconductor structures.

13. The method of claim 11, further comprising designing each of the one or more substrate measurement structures to comprise the contact and the gate, on a substrate, the contact being shifted one of closer to and farther from the gate in comparison to the respective one of the one or more original semiconductor structures.

14. The method of claim 11, further comprising determining at least one of a mean and a standard deviation of the space distribution.

15. The method of claim 11, further comprising shifting the determined space distribution by one or more predetermined contact shifts in the one or more STI and substrate measurement structures.

16. The method of claim 11, further comprising scaling electrical parameters of at least one of the one or more original semiconductor structures, the one or more STI measurement structures, and the one or more substrate measurement structures based on a fatal area ratio and a design area ratio, of the one or more original semiconductor structures.

* * * * *